Figure 1:
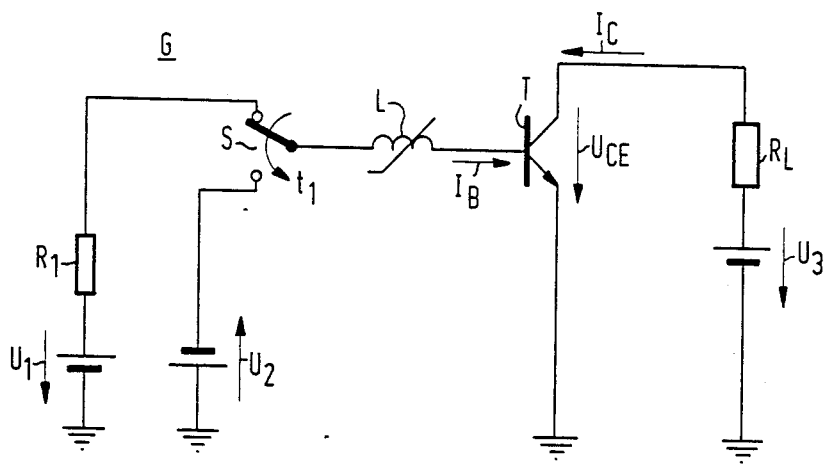

United States Patent [19]

Löhn

[11] Patent Number: 4,794,274
[45] Date of Patent: Dec. 27, 1988

[54] CIRCUIT ARRANGEMENT FOR REMOVING CARRIERS IN A TRANSISTOR

[75] Inventor: Klaus B. Löhn, Lammersdorf, Fed. Rep. of Germany

[73] Assignee: U.S. Philips Corporation, New York, N.Y.

[21] Appl. No.: 718,689

[22] Filed: Apr. 1, 1985

[30] Foreign Application Priority Data

Apr. 7, 1984 [DE] Fed. Rep. of Germany ....... 3413208

[51] Int. Cl.$^4$ .......................... H03K 17/60; H03K 3/33
[52] U.S. Cl. ..................................... 307/253; 307/280; 307/300; 307/314; 323/289
[58] Field of Search .......................... 307/300, 314, 280; 323/289

[56] References Cited

U.S. PATENT DOCUMENTS

| | | | |
|---|---|---|---|
| 3,127,522 | 3/1964 | Thorndyke | 307/314 |
| 3,631,314 | 12/1971 | Hetterscheid | 307/253 |
| 3,818,253 | 6/1974 | Chafer et al. | 307/314 |
| 4,200,813 | 4/1980 | Van Schaik et al. | 307/300 |
| 4,227,099 | 10/1980 | Houkes | 307/315 |

FOREIGN PATENT DOCUMENTS

| | | | |
|---|---|---|---|
| 648490 | 9/1962 | Canada | 307/314 |
| 169662 | 9/1965 | U.S.S.R. | 323/289 |

Primary Examiner—Stanley D. Miller
Assistant Examiner—B. P. Davis
Attorney, Agent, or Firm—Bernard Franzblau

[57] ABSTRACT

A circuit arrangement for switching a current through the emitter-collector path of a bipolar transistor whose base receives a substantially square-wave switching signal from a switching generator via a series-arranged two-terminal network having inductive reactance. This signal switches the transistor alternately to the conducting and the non-conducting state. In such a circuit arrangement, a very short fall time of the current in the emitter-collector path of the transistor is achieved in a simple and economical way in that the value of the inductive reactance decreases when a current flowing through the two-terminal network increases.

11 Claims, 1 Drawing Sheet

CIRCUIT ARRANGEMENT FOR REMOVING CARRIERS IN A TRANSISTOR

This invention relates to a circuit arrangement for switching a current through the emitter-collector path of a bipolar transistor having a base connection to which a substantially square-wave signal is applied from a switching signal generator via a two-terminal network with inductive reactance arranged in series, this signal alternately switching the transistor to the conducting and to the non-conducting states.

Such a circuit arrangement is known from the "Handbuch Schalttransistoren" (switching transistors manual), published in 1979 by Thomson-CSF GmbH, Section 5.5, pages 101 etc. The circuit arrangement described there comprises an non-switching transistor having a base connection connected to a first contact of a switch via an inductance. The first contact of the switch is optionally connectable to second or third contacts. The second contact is connected to a voltage source which applies a voltage to this contact that is positive with respect to the emitter, whereas the third contact of the switch is connected to a second voltage source which supplies to the third contact a voltage which is negative with respect to the emitter of the transistor. The two voltages can alternately be applied to the base connection of the transistor via the switch and the inductance.

In the position of the switch in which the first and second contacts are interconnected, a positive voltage is applied to the base terminal of the transistor in the steady state, after switch-on transients have decayed. A positive current flows through the base connection of the transistor which, in response thereto, is adjusted to the saturated state. In this state the conductivity of the transistor becomes particularly high, that is to say the voltage between the collector and the emitter connections of the transistor becomes particularly small so that the dissipation in the transistor is reduced to a minimum. The transistor is then capable of carrying high-currents in its emitter-collector path at a low thermal load.

In the saturated state, that is to say in the state in which the transistor has an extremely high conductivity, a high concentration of minority charge carriers occur, more specifically in the collector area of the transistor. These minority charge carriers must recombine when the transistor is switched from the conductive to the non-conductive state. The recombination of the minority charge carriers requires a given period of time, during which a current still flows in the emitter-collector path of the transistor, but simultaneously a significant collector-emitter voltage can already occur. The dissipation then produced can thermally destroy the transistor.

The dissipation in the transistor upon switching the transistor from the conducting to the non-conducting state can be reduced by removing the largest possible portion of the minority charge-carriers from the emitter-collector path, as long as a collector current injected by the emitter still flows and, consequently, before a significant voltage drop occurs at the collector. The minority charge carriers are removed by applying a negative voltage to the base and consequently by a negative base current. This current is efficiently so matched that the emitter-base path remains conductive, which means that the emitter continues to inject collector current. A negative base current, which at the start is small and becomes greater after the major part of the minority charge carriers have been removed, is particularly efficient. To that end the inductance mentioned in the opening paragraph, which causes the base current to change gradually to negative values, is provided in the prior art circuit arrangement between the switch and the base terminal of the transistor. During this gradual current change the minority carriers can recombine. The base-emitter junction of the transistor then remains conductive and is not cut-off until the transistor changes from the saturated to the active state as a result of the recombination of the minority charge carriers. The time from the beginning of the change in the base current until the active state is reached is called the storage time.

The decrease in the collector current occurs during the active state of the transistor within the so-called fall time. Within this fall time substantially the overall dissipation occurs in the transistor. It is therefore desirable, so as to reduce the dissipation and consequently the thermal load of the transistor, to reduce the fall time as much as possible. At the end of the storage time residual minority charge carriers are still present in the transistor, which are now efficiently removed by a high negative base current pulse. This considerably reduces the fall time which otherwise is determined by a recombination of the residual minority charge carriers by the collector current.

Circuit arrangements for reducing the fall time by using a high negative current pulse at the end of the storage time are known from the "Handbuch Schalttransistoren" mentioned above, more specifically, for example, from FIG. 17a on page 106 or FIG. 24 on page 130. The circuit arrangements described there are however very complicated and costly and moreover require a lot of space.

It is an object of the invention to provide a simple, cheap circuit arrangement, which does not occupy much space, for switching a current through the emitter-collector path of a bipolar transistor having a minimum fall time for the current.

According to the invention, this object is accomplished in that the two-terminal network is of such a structure that the value of the inductive reactance decreases when a current flowing through the two-terminal network increases.

At low currents, the two-terminal network of the structure according to the invention has a higher inductive reactance than for high currents, but it varies non-linearly versus a progressive current variation. A low current through the two-terminal network is at first opposed by a higher inductive reactance so that as a function of time, the change in the current is only small. At an increasing current the inductive reactance decreases and the change of the current per unit of time becomes large. In the circuit arrangement according to the invention the base current of the transistor flows via such a two-terminal network. If the transistor is in the conductive state an initially relatively low base current flows. When the switching signal applied to the base terminal changes its value, the base current follows this change at first only slowly because of the high inductive reactance of the two-terminal network. After a certain period of time the base current will have increased by a given amount such that the inductive reactance decreases and a faster rise in the base current occurs.

The circuit arrangement is now preferably dimensioned such that the period of time during which the current through the two-terminal network is fundamentally low, and changes only slightly, corresponds to the storage time of the transistor, that is to say it corresponds to the period of time during which the reduction of the minority charge carriers by the applied base current is effected. The steep increase of the base current following after this period of time then accurately coincides with the instant at which the transistor enters the active stage. The transistor is then rapidly adjusted to the non-conductive state, that is to say the collector current of the transistor has a very short fall time.

In accordance with an advantageous further embodiment of the invention, the two-terminal network is constituted by a coil having a core of magnetizable material which is magnetized into the saturated state by the current flowing in the base connection of the transistor. Preferably, the coil is provided with some conductive turns on a closed ferrite ring core. By choosing appropriate dimensions of the ring core, its magnetic properties and also the number of turns, a coil of such a structure can easily be matched to the dimensioning of the rest of the circuit arrangement. In addition, the described coil can be produced in a simple way and at an advantageous price and is very compact.

Figure 2:
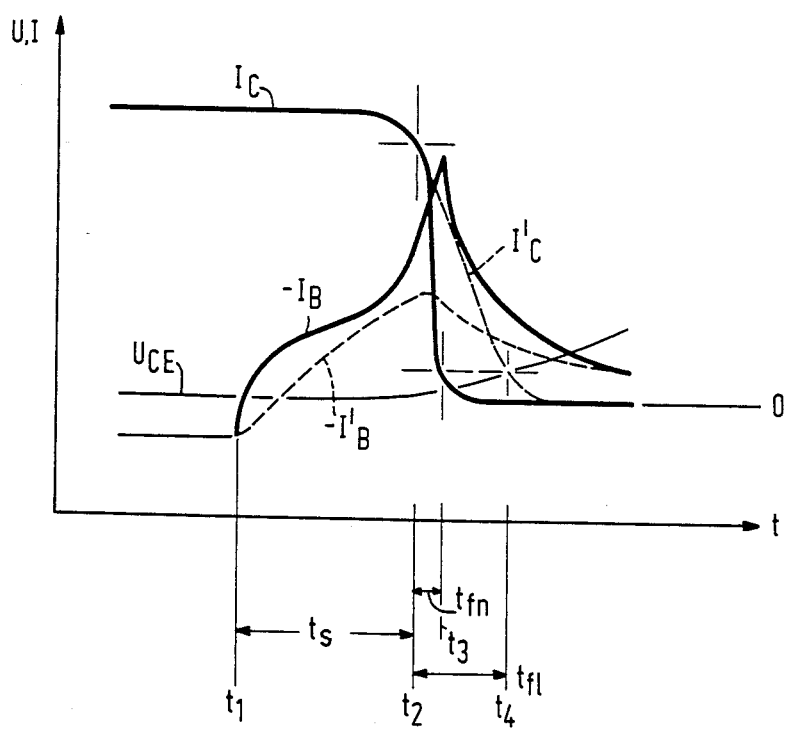

An embodiment of the invention is shown in the accompanying drawing and will now be described by way of example, with reference thereto. In the drawing:

FIG. 1 shows a principle circuit diagram of a circuit arrangement according to the invention, and FIG. 2 shows the variations with time of some signals in FIG. 1.

In FIG. 1, G denotes the equivalent circuit diagram of a switching signal generator. This generator comprises two d.c. voltage sources which supply the positive voltages $U_1$ and $U_2$ in the directions indicated by the arrows. The resistor $R_1$ represents the internal resistance of the d.c. voltage source $U_1$. The direct voltages $U_1$ and $U_2$ are optionally applied via a switch S to a first terminal of a two-terminal network L having an inductive reactance. The second terminal of this network is connected to the base connection of a transistor T of the npn-conductivity type. The base current $I_b$ of the transistor T flows in a positive current direction to the base connection of the transistor T via the two-terminal network. Those terminals of the d.c. voltage sources $U_1$ and $U_2$ which are remote from the resistor $R_1$ and the switch S, respectively, are connected to ground.

The transistor T is also connected to ground by means of its emitter connection and via a load resistor $R_L$, of a third d.c. voltage source, which produces a direct voltage $U_3$ and whose negative pole is connected to ground. The third d.c. voltage source $U_3$ conveys a current $I_C$ in the positive flow direction, indicated by the arrow, through the load resistor $R_L$ and through the emitter-collector path of the transistor T. The value of the current $I_C$ is controlled by the current $I_B$ flowing into the base connection of the transistor T. The switch S is then in the position shown, that is to say the base connection of the transistor T is connected to the positive voltage $U_1$ via the two-terminal network L and the resistor $R_1$.

In FIG. 2, the variations with time of the currents $I_B$ and $I_C$ and also the variation with time of the voltage $U_{CE}$ through the emitter-collector path of the transistor T are plotted versus the time. After the switch-on phenomena, occurring on turn-on of the switch S, have decayed, a steady state is obtained in which the currents $I_B$ and $I_C$ and also the voltage $U_{CE}$ are constant.

At an instant $t_1$ the switch S is changed-over and as a result thereof the base connection of the transistor T is connected to the d.c. voltage source $U_2$ via the two-terminal network L. At the instant $t_1$, the transistor T is in the saturated state. A voltage with inverted polarity, by which the polarity of the current $I_B$ is reversed, is now connected to the two-terminal network L. Because of the inductive reactance of the two-terminal network L, the value of the current $I_B$ gradually changes from positive to negative values. In the example shown, the two-terminal network L, for example a coil having a ferrite ring core, has a hysteresis characteristic. Also, in the event of a drive over only a portion of the overall hysteresis curve, a new hysteresis curve, referred to as a sub-loop is obtained. In the example shown, only a sub-loop of the characteristic of the two-terminal network is driven in the range between the positive base current in the saturated state of the transistor T and negative current values which are higher compared therewith. Therefore, upon polarity reversal, the current $I_B$ rapidly reduces to a low value immediately after the instant $t_1$. In the range of smaller current intensities, only a show change in the current $I_B$ is obtained until, upon reaching sufficiently higher negative values, a fast change in the current $I_B$ starts again.

The components of the circuit arrangement, more specifically the resistor $R_2$ and the inductive reactance of the two-terminal network L, are chosen such that the second fast change with time of the current $I_B$ occurs in the region of an instant $t_2$, which is spaced in time by $t_s$ from the instant $t_1$. In this situation, $t_s$ denotes the storage time of the transistor T, that is to say the time in which the minority charge carrier density in the transistor T is reduced to such an extent that the transistor T is adjusted from the saturated to the active state.

At the subsequent fast increase in the current $I_B$, the transistor T is driven in a very short period of time through the active to the cut-off state. This is effected in the interval between the instants $t_2$ and $t_3$, which is referred to as the fall time $t_{fn}$. In the fall time $t_{fn}$ the collector current $I_C$ of the transistor T decreases from 90% to 10% of its value at the instant $t_1$. With the decrease in the collector current $I_C$ the current $I_B$ then also falls to zero. Simultaneously, the voltage $U_{CE}$ across the emitter-collector path of the transistor T increases to the final value $U_3$. In the signal variations shown in FIG. 2 this increase occurs with a compartively flat curve because of a protection capacitor arranged in parallel with the emitter-colletor path of the transistor T, which is not shown in FIG. 1.

FIG. 2 further illustrates, by means of dotted lines, for the purpose of comparison, the case in which a coil having a constant, that is to say current-independent, reactance is used as the two-terminal network L. Then a substantially linear change with time of the current $I_B$ is obtained, which is represented by the curve $I'_B$. The current $I'_B$ changes uniformly until the transistor T arrives in the active state, and then decreases to zero. The transistor T is adjusted significantly slower to the non-conductive state. The variation with time of the collector current is illustrated by means of a dotted line denoted by $I'_C$. It does not reach 10% of the value it had at the instant $t_1$ until the instant $t_4$. The fall time $t_{f1}$, i.e. the time interval between the instants $t_2$ and $t_4$, is significantly longer than $t_{fn}$.

What is claimed is:

1. A circuit arrangement for switching a current through the emitter-collector path of a bipolar transistor having a base connection comprising: means for applying a substantially square-wave signal to said base connection from a switching signal generator via a series connected two-terminal network including an inductive reactance, said signal alternately switching the transistor to a conducting saturation state and to a non-conducting state, characterized in that the two-terminal network is of such a structure that the value of the inductive reactance decreases responsive to an increase of a current flowing through the two-terminal network.

2. A circuit arrangement as claimed in claim 1, characterized in that the two-terminal network comprises a coil having a core of magnetizable material which is magnetized into the saturated state by a negative current flowing in the base connection of the transistor when said square-wave signal switches the transistor from the conducting saturation state to the non-conducting state, and wherein said coil is magnetically isolated from the collector of the transistor.

3. A high speed transistor switching circuit for switching a transistor between a saturation condition and a cut-off condition comprising: a source of square wave switching signal coupled to a base electrode of said transistor via a two-terminal network that includes an inductive reactance operative to accelerate the removal of minority charge carriers from the base-collector region of the transistor when the switching signal drives the transistor from the saturation condition to the cut-off condition, said two-terminal network being connected in series between an output terminal of said switching signal source and the transistor base electrode so that a negative base current flows through said inductive reactance, the two-terminal network producing a decrease in the inductive reactance when said negative base current flowing through the two-terminal network increases above a given level.

4. A high speed switching circuit as claimed in claim 3 wherein said inductive reactance produces a non-linear current characteristic for the negative base current flowing through the two-terminal network during the transition of the transistor from the saturation condition to the cut-off condition.

5. A high speed switching circuit as claimed in claim 3 wherein said inductive reactance of the two-terminal network comprises a saturable reactor having a coil through which the negative base current flows during the transition of the transistor from the saturation condition to cut-off condition, said negative base current driving the saturable reactor into saturation with a time delay approximately equal to the storage time of the transistor.

6. A high speed switching circuit as claimed in claim 3 wherein said inductive reactance of the two-terminal network produces a hysteresis type current characteristic for negative base current flowing in the two-terminal network during the transition of the transistor from the saturation condition to the cut-off condition.

7. A high speed switching circuit as claimed in claim 6 wherein the inductive reactance of the two-terminal network comprises a saturable reactor having a coil through which the negative base current flows and drives the saturable reactor into saturation during the transition of the transistor from the saturation condition to the cut-off condition.

8. A circuit arrangement as claimed in claim 1 wherein said inductive reactance is connected in the two-terminal network so that the inductive reactance passes base current in both a positive and negative direction, said negative base current flowing when the switching signal drives the transistor from the conducting state to the non-conducting state, said inductive reactance decreasing to a low value during the period when the negative base current flows and due solely to said negative base current.

9. A circuit arrangement as claimed in claim 1 wherein said two-terminal network comprises a bidirectional network that provides approximately the same impedance to current flow in either direction thereof.

10. A circuit arrangement as claimed in claim 1 wherein said inductive reactance comprises a saturable reactor which passes a negative base current when the switching signal drives the transistor into the non-conducting state, said saturable reactor then being operative in responsive to the negative base current flowing therein to remove minority charge carriers from the base-collector region of the transistor.

11. A high-speed switching circuit as claimed in claim 3 wherein said inductive reactance of the two-terminal network comprises a saturable reactor through which the negative base current flows during the transition of the transistor from the saturation condition to the cut-off condition, said saturable reactor passing a positive base current when the transistor is in the saturation condition.

* * * * *